US007357963B2

(12) United States Patent
Jung

(10) Patent No.: US 7,357,963 B2
(45) Date of Patent: Apr. 15, 2008

(54) APPARATUS AND METHOD OF CRYSTALLIZING AMORPHOUS SILICON

(75) Inventor: Yun-Ho Jung, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 85 days.

(21) Appl. No.: 10/025,907

(22) Filed: Dec. 26, 2001

(65) Prior Publication Data

US 2002/0083557 A1   Jul. 4, 2002

(30) Foreign Application Priority Data

Dec. 28, 2000   (KR) .............................. 2000-83763

(51) Int. Cl.
*B05D 3/06* (2006.01)
*C30B 1/08* (2006.01)
*C30B 21/04* (2006.01)
*C30B 13/22* (2006.01)

(52) U.S. Cl. ............... 427/554; 427/555; 438/487; 438/798; 438/799; 117/8; 117/10

(58) Field of Classification Search ............... 427/554, 427/555; 438/487, 798, 799; 117/7, 8, 9, 117/10
See application file for complete search history.

(56) References Cited

U.S. PATENT DOCUMENTS

| 6,326,286 | B1 * | 12/2001 | Park et al. ............... 438/478 |
| 6,368,945 | B1 * | 4/2002 | Im ............... 438/487 |
| 6,495,405 | B2 * | 12/2002 | Voutsas et al. ............... 438/166 |
| 6,514,339 | B1 * | 2/2003 | Jung ............... 117/107 |
| 6,537,863 | B1 * | 3/2003 | Jung ............... 438/166 |
| 6,555,449 | B1 * | 4/2003 | Im et al. ............... 438/487 |
| 6,573,163 | B2 * | 6/2003 | Voutsas et al. ............... 438/487 |
| 6,573,531 | B1 * | 6/2003 | Im et al. ............... 438/486 |
| 6,686,978 | B2 * | 2/2004 | Voutsas ............... 349/44 |
| 6,767,804 | B2 * | 7/2004 | Crowder ............... 438/487 |
| 6,770,545 | B2 * | 8/2004 | Yang ............... 438/487 |
| 6,777,276 | B2 * | 8/2004 | Crowder et al. ............... 438/166 |
| 6,867,151 | B2 * | 3/2005 | Jung ............... 438/778 |
| 6,908,835 | B2 * | 6/2005 | Sposili et al. ............... 438/487 |
| 6,946,367 | B2 * | 9/2005 | Matsumura et al. ............... 438/471 |
| 6,949,422 | B2 * | 9/2005 | Kim ............... 438/166 |
| 6,961,117 | B2 * | 11/2005 | Im ............... 355/67 |
| 6,984,573 | B2 * | 1/2006 | Yamazaki et al. ............... 438/487 |
| 6,989,300 | B1 * | 1/2006 | Tanabe ............... 438/166 |
| 7,008,863 | B2 * | 3/2006 | Kim et al. ............... 438/479 |

(Continued)

FOREIGN PATENT DOCUMENTS

JP   08-288194   11/1996

(Continued)

*Primary Examiner*—Marianne Padgett
(74) *Attorney, Agent, or Firm*—McKenna, Long & Aldridge LLP

(57) ABSTRACT

A sequential lateral solidification apparatus includes a laser generator for generating and emitting a laser beam; an X-Y stage movable in two orthogonal axial directions; and a mask arranged between the laser generator and the X-Y stage. The mask has a plurality of slits through which the laser beam passes. An objective lens for scaling down the laser beam is arranged between the mask and the X-Y stage. A mask stage is connected to the mask for controlling minute movement of the mask for crystallizing amorphous silicon in one block.

10 Claims, 5 Drawing Sheets

U.S. PATENT DOCUMENTS

| | | | |
|---|---|---|---|
| 7,015,123 B2 * | 3/2006 | Yang | 438/486 |
| 7,064,016 B2 * | 6/2006 | Kasahara et al. | 438/149 |
| 7,071,082 B2 * | 7/2006 | Jung | 438/486 |
| 7,135,388 B2 * | 11/2006 | Ryu et al. | 438/478 |
| 7,192,627 B2 * | 3/2007 | Jung | 427/554 |
| 7,250,331 B2 * | 7/2007 | Kim | 438/166 |
| 7,294,857 B2 * | 11/2007 | Kim et al. | 257/72 |
| 2001/0019863 A1 * | 9/2001 | Yang | 438/487 |
| 2003/0064551 A1 * | 4/2003 | Voutsas | 438/487 |
| 2003/0215973 A1 * | 11/2003 | Yamazaki et al. | 438/48 |
| 2003/0235971 A1 * | 12/2003 | Yamazaki et al. | 438/487 |
| 2004/0060504 A1 * | 4/2004 | Takeda et al. | 117/84 |
| 2004/0076894 A1 * | 4/2004 | Hwang | 430/5 |
| 2004/0135205 A1 * | 7/2004 | Jung | 257/350 |
| 2004/0201019 A1 * | 10/2004 | Kim et al. | 257/59 |
| 2004/0235279 A1 * | 11/2004 | Kim | 438/488 |
| 2004/0266146 A1 * | 12/2004 | Jung | 438/487 |
| 2005/0040148 A1 * | 2/2005 | Jung | 219/121.65 |
| 2005/0095762 A1 * | 5/2005 | Kim | 438/166 |
| 2005/0139925 A1 * | 6/2005 | You | 257/351 |
| 2005/0142299 A1 * | 6/2005 | Kim et al. | 427/532 |
| 2005/0142450 A1 * | 6/2005 | Jung | 430/5 |
| 2005/0142452 A1 * | 6/2005 | You | 430/5 |
| 2005/0142453 A1 * | 6/2005 | Seo et al. | 430/5 |
| 2005/0173752 A1 * | 8/2005 | Chung et al. | 257/315 |
| 2005/0181136 A1 * | 8/2005 | Jung | 427/372.2 |
| 2005/0202654 A1 * | 9/2005 | Im | 438/487 |
| 2005/0233511 A1 * | 10/2005 | You | 438/166 |
| 2005/0235903 A1 * | 10/2005 | Im et al. | 117/4 |
| 2005/0271952 A1 * | 12/2005 | Jung | 430/5 |
| 2006/0003506 A1 * | 1/2006 | You | 438/166 |
| 2006/0009016 A1 * | 1/2006 | Yamazaki et al. | 438/487 |
| 2006/0035478 A1 * | 2/2006 | You | 438/795 |
| 2006/0040512 A1 * | 2/2006 | Im | 438/795 |
| 2006/0060130 A1 * | 3/2006 | Im | 117/46 |
| 2006/0065186 A1 * | 3/2006 | Kumoni | 117/92 |
| 2006/0102901 A1 * | 5/2006 | Im et al. | 257/64 |
| 2006/0121369 A1 * | 6/2006 | Hwang | 430/5 |
| 2006/0154154 A1 * | 7/2006 | Sun | 430/5 |

FOREIGN PATENT DOCUMENTS

| | | |
|---|---|---|
| KR | 1999-0066360 | 8/1999 |

* cited by examiner

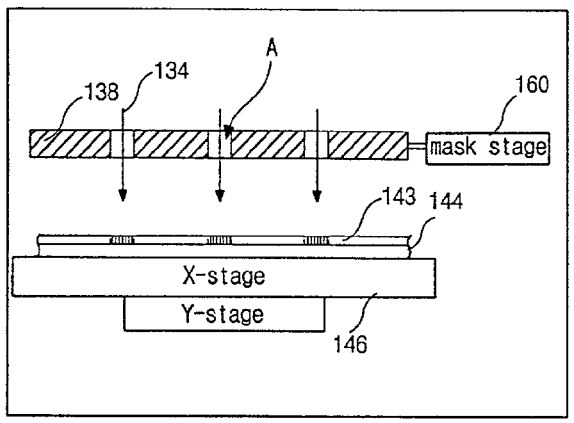
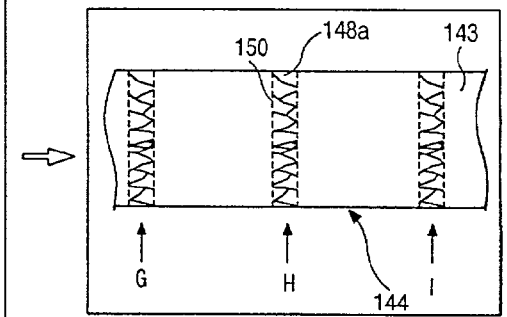
*FIG. 5A*      *FIG. 5B*
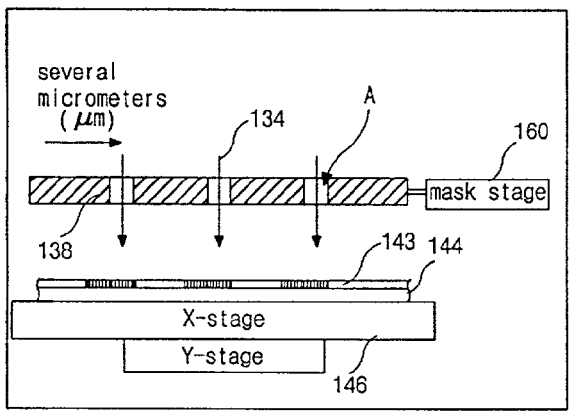
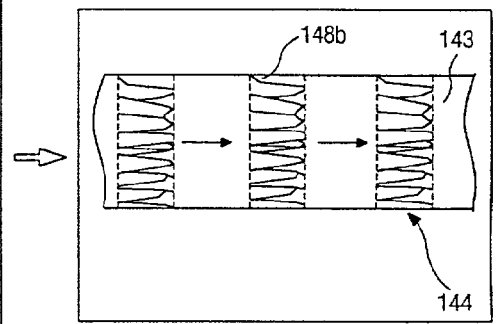
*FIG. 5C*      *FIG. 5D*
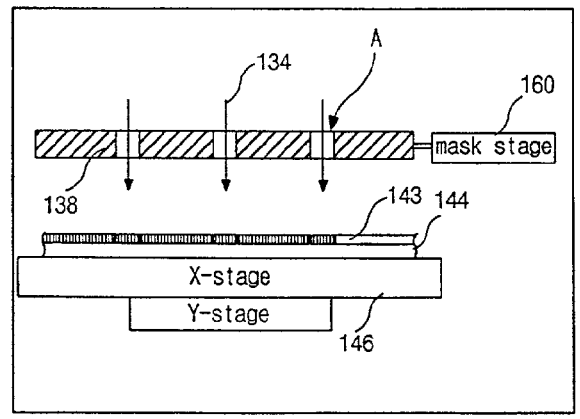
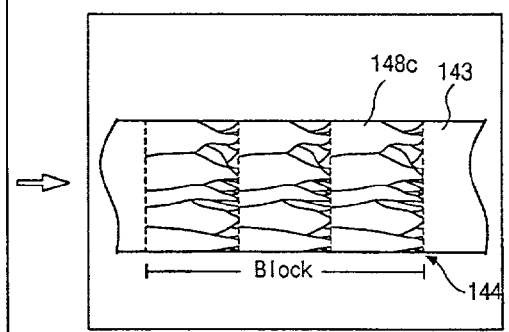
*FIG. 5E*      *FIG. 5F*

APPARATUS AND METHOD OF CRYSTALLIZING AMORPHOUS SILICON

This application claims the benefit of Korean Patent Application No. 2000-83763, filed on Dec. 28, 2000 in Korea, which is hereby incorporated by reference as it sully set forth herein.

BACKGROUND OF THE INVENTION

1. Field of the Invention

The present invention relates to an apparatus and method of crystallizing an amorphous silicon film, and more particularly, to a sequential lateral solidification (SLS) apparatus and a crystallization method using the SLS apparatus.

2. Discussion of Related Art

Generally, polycrystalline silicon (p-Si) or amorphous silicon (a-Si) are materials used as the active layer of thin film transistor (TFTs) in liquid crystal display (LCD) devices. Since amorphous silicon (a-Si) can be deposited at a low temperature to form a thin film on a glass substrate, it is more widely used as an element of a switching device in liquid crystal display (LCD) devices. However, amorphous silicon (a-Si) has a difficulty in being employed in the large LCD devices because of its electrical characteristics.

In contrast to amorphous silicon, polycrystalline silicon provides faster display response time when used as an element of the TFT. Thus, polycrystalline silicon (p-Si) can be used in the large-sized LCD devices, laptop computers and wall television sets which need a larger field effect mobility of more than 30 cm$^2$/Vs and a low leakage current.

Polycrystalline silicon is composed of crystal grains and grain boundaries. If the grains are larger and the grain boundaries are regularly distributed within the polycrystalline silicon, the field effect mobility becomes larger. In view of these grains and grain boundaries, a silicon crystallization method that produces large grains currently becomes an important issue. Accordingly, a sequential lateral solidification (SLS), which induces lateral growth of silicon grains to form single-crystal silicon film using laser energy, is proposed.

The SLS method of crystallizing an amorphous silicon layer uses the fact that silicon grains tend to grow vertically against the interface between liquid and solid silicon, and teaches that the amorphous silicon layer is crystallized by controlling the magnitude of laser energy and an irradiation of a moving laser beam to form silicon grains growing latterly up to a predetermined length. Therefore, to conduct the SLS method, an SLS apparatus is required as shown in FIG. 1.

FIG. 1 is a schematic configuration of a sequential lateral solidification (SLS) apparatus according to a conventional art. In FIG. 1, the SLS apparatus 32 widely includes a laser generator 36, a mask 38, a condenser lens 40 and an objective lens 42. The laser generator 36 generates and emits a laser beam 34. The amount of the laser beam 34 emitted from the laser generator 36 is adjusted by an attenuator (not shown) that is in the path of the laser beam 34. The emitted laser beam 34 is applied to the condenser lens 40 such that the laser beam 34 is condensed after passing the condenser lens 40. The mask 38 includes a plurality of slits "A" through which the laser beam 34 passes and light absorptive areas "B" that absorb the laser beam 34. At this point, the width of each slit "A" defines a size of the grain when amorphous silicon is crystallized by a first laser irradiation. Furthermore, the distance between each slit defines a size of the lateral grain growth when the amorphous silicon film is crystallized by the SLS method. The objective lens 42 is arranged below the mask and scales down the shape of the laser beam having passed through the mask 38.

Further in FIG. 1, an X-Y stage 46 is arranged adjacent to the objective lens 42. The X-Y stage is movable in two orthogonal axial directions, such as x-axis and y-axis, and includes an x-axial direction drive unit for driving the x-axis stage and a y-axial direction drive unit for driving the y-axis stage. A substrate 44 is placed on the X-Y stage 46 in a location corresponding to the mask. Although not shown in FIG. 1, an amorphous silicon film is formed on the substrate 44, thereby defining a sample substrate. In this conventional configuration of the SLS apparatus, the laser generator 36 and the mask 38 are fixed in a corresponding position such that the mask 38 is not movable to crystallize the amorphous silicon film of the sample substrate 44. Thus, the X-Y stage should minutely move in an x-axial or y-axial direction to crystallize all the sample substrate 44.

A method of crystallizing an amorphous silicon film using the above-described SLS apparatus is explained hereinafter. A crystalline silicon film is generally formed by crystallizing the amorphous silicon film previously deposited on a substrate. The amorphous silicon film is deposited on the substrate using a chemical vapor deposition (CVD) method and includes a lot of hydrogen therein. The amorphous silicon film is thermal-treated to conduct the de-hydrogenation thereof, thereby reducing the amount of the hydrogen contained in the amorphous silicon film. The reason for the de-hydrogenation is to make a surface of the crystalline silicon film smooth. If the de-hydrogenation is not conducted, the surface of the crystalline silicon film becomes rough, and thus the electrical characteristics of the crystalline silicon film become degraded.

FIG. 2 is a plan view showing a substrate 44 having a partially-crystallized amorphous silicon film 52. When crystallizing the amorphous silicon film using the laser beam, it is difficult to crystallize a whole region of the amorphous silicon film at one time because the laser beam is restricted in its width, and the mask are also restricted in its size. Therefore, when the substrate is a large size, the mask should be arranged many times over the substrate, and thus, the crystallization processes are also repeated many times corresponding to each mask arrangement. In FIG. 2, an area "C" corresponding to one mask is defined as one block. At this point, the crystallization of the amorphous silicon within one block "C" is achieved by irradiating the laser beam several times.

The crystallization process of the amorphous silicon film will be explained as follows. FIGS. 3A to 3C are plan views showing one block of an amorphous silicon film in the crystallization process steps by using a conventional SLS apparatus. At this time, it is supposed that the mask has three slits therein.

FIG. 3A shows an initial step of crystallizing the amorphous silicon film when a first laser beam irradiation is carried out. As described in FIG. 1, the laser beam 34 emitted from the laser generator 36 passes through the mask 38 and irradiates one block of the amorphous silicon film 52 deposited on the sample substrate 44. At this time, the laser beam 34 is divided into three line beams by the slits "A", and then these line beams irradiates regions "D", "E" and "F" of the amorphous silicon film 52 in order to melt each region "D", "E" or "F". The energy density of the line beams is sufficient to induce complete melting of the amorphous silicon film. The liquid phase silicon begins to be crystallized at the interface 56 between the solid phase amorphous silicon and the liquid phase silicon. Namely, lateral grain growth of grains 58a proceeds from the un-melted regions adjacent to the fully-melted regions. The grain boundaries in directionally solidified silicon tends to form so as to always be perpendicular to the interface 56 between the solid phase amorphous silicon and the liquid phase silicon. As a result of the first laser beam irradiation, crystallized regions "D", "E" and "F" are finally formed in one block corresponding to the mask 38 of FIG. 1, such that crystallized silicon grain regions "D", "E" and "F" are induced.

FIG. 3B shows a step of crystallizing the amorphous silicon film when a second laser beam irradiation is carried out. After the first laser beam irradiation, the X-Y stage moves in a direction opposite to the lateral grain growth by a distance of several micrometers that is the same as or less than the length of the lateral growth. Then, the second laser beam irradiation is conducted. Therefore, the regions irradiated by the second laser beam are melted and then crystallized in the manner described in FIG. 3A. At this time, the silicon grains 58a grown by the first laser beam irradiation serve as seeds for the crystallization, and thus the lateral grain growth proceeds in the melted regions. Silicon grains 58b formed by the second laser beam irradiation continue to grow adjacent to the silicon grains 58a formed by the first laser beam irradiation.

Accordingly, by repeating the foregoing steps of melting and crystallizing the amorphous silicon, one block of the amorphous silicon film is crystallized to form grains 58c as shown in FIG. 3C. FIG. 3C shows one block of a crystalline silicon film resulted from lateral growth of grains to predetermined sizes.

Moreover, the above-mentioned crystallization processes conducted within one block are repeated through block by block in the amorphous silicon film. Therefore, the amorphous silicon film can be converted into the crystalline silicon film although it has a large size. However, the conventional SLS apparatus described above has some problems as follows.

First, in the crystallization process which uses the laser beam passing through the slits of the mask, the X-Y stage moves by a distance of several micrometers or millimeters to induce the lateral grain growth. However, it is very difficult to control the movement distance using the relatively large X-Y stage. Second, it takes 0.1 to 1 seconds that the X-Y stage moves and stops. However, if the substrate and the X-Y stage are large in size, it takes much more time to move the X-Y stage. Accordingly, the yield of crystallizing the amorphous silicon film is lowered.

SUMMARY OF THE INVENTION

Accordingly, the present invention is directed to a method and apparatus of crystallizing an amorphous silicon film using a sequential lateral solidification (SLS) that substantially obviates one or more of problems due to limitations and disadvantages of the related art.

An advantage of the present invention is to provide a sequential lateral solidification (SLS) apparatus which saves time in crystallizing an amorphous silicon film to obtain a productivity increase.

Another advantage of the present invention is to provide a method of crystallizing an amorphous silicon layer with increased manufacturing yield using the improved SLS apparatus.

Additional features and advantages of the invention will be set forth in the description which follows, and in part will be apparent from the description, or may be learned by practice of the invention. The objectives and other advantages of the invention will be realized and attained by the method particularly pointed out in the written description as well as the appended drawings.

To achieve these and other advantages and in accordance with the purpose of the present invention, as embodied and broadly described, a sequential lateral solidification (SLS) apparatus for crystallizing an amorphous silicon film includes a laser generator generating and emitting a laser beam; an X-Y stage corresponding to the laser generator and moving in two orthogonal axial directions; a mask arranged between the laser generator and the X-Y stage, the mask having a plurality of slits through which the laser beam passes; an objective lens arranged between the mask and the X-Y stage, the objective lens scaling down the laser beam; and a mask stage connected to the mask, the mask stage controlling a minute movement of the mask.

The above-mentioned apparatus further includes a condenser lens between the mask and the laser generator. Also, the condenser lens condenses the laser beam. In the above SLS apparatus, the X-Y stage is movable a longer way than the mask controlled by the mask stage.

In another aspect, a method of crystallizing an amorphous silicon film using the SLS apparatus includes the steps of setting a substrate having an amorphous silicon film thereon upon the X-Y stage; applying the laser beam to the amorphous silicon film after the laser beam passes through the plurality of slits of the mask; melting first portions of the amorphous silicon film, wherein each first portion of the amorphous silicon film corresponds to each slit of the mask; crystallizing the first portions of the amorphous silicon film by the sequential lateral solidification; moving the mask by several micrometers using the mask stage; repeatedly melting and crystallizing next portions of the amorphous silicon film adjacent to the first portions whenever the mask is moved by the mask stage until a lateral grain growth stops by a collision of laterally grown grains, thereby defining a block in the amorphous silicon film; moving the X-Y stage having the substrate to crystallize another block of the amorphous silicon film; and repeatedly melting and crystallizing another blocks of the amorphous silicon film whenever the X-Y stage moves.

In the above method, the laser beam irradiates the amorphous silicon film whenever the mask is moved by the mask stage. Beneficially, the mask stage moves the mask in a direction of later grain growth by a distance of several micrometers which is equal to or less than the length of the lateral growth.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings:

FIGS. 5A to 5F shows crystallization process steps of crystallizing an amorphous silicon film into a crystalline silicon film using the SLS apparatus of FIG. 4.

DETAILED DESCRIPTION OF THE ILLUSTRATED EMBODIMENTS

Reference will now be made in detail to the preferred embodiments of the present invention, examples of which are shown in the accompanying drawings. Wherever possible, similar reference numbers will be used throughout the drawings to refer to the same or like parts.

Figure 1:
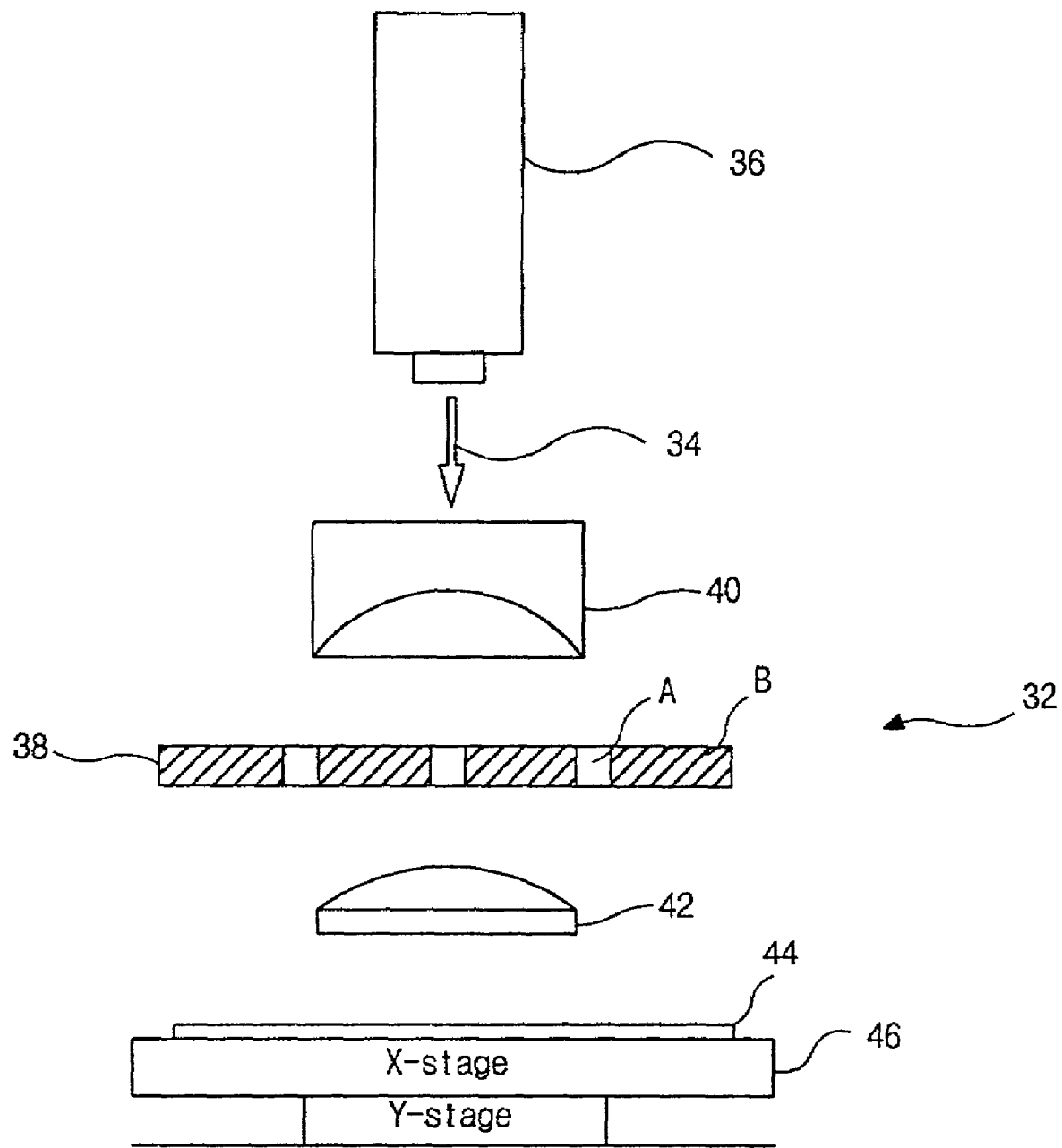
FIG. 1 is a schematic configuration of a sequential lateral solidification (SLS) apparatus according to a conventional art.
Figure 2:
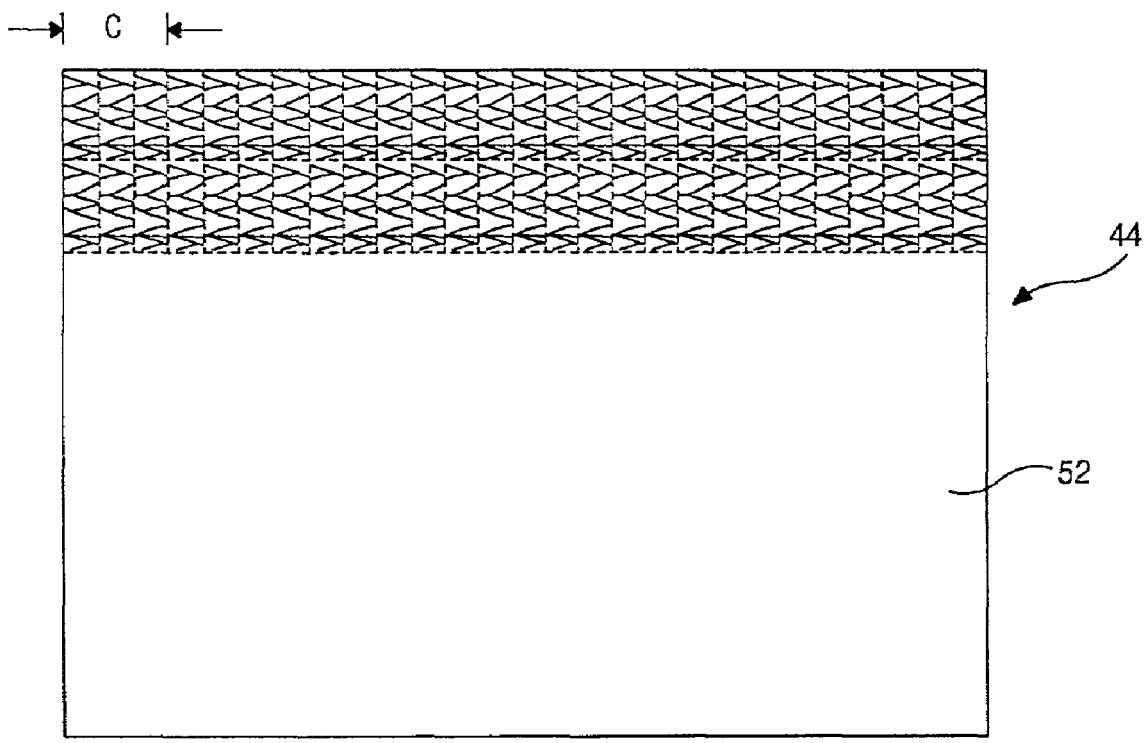
FIG. 2 is a plan view showing a substrate having a partially-crystallized amorphous silicon film.
Figure 3A:
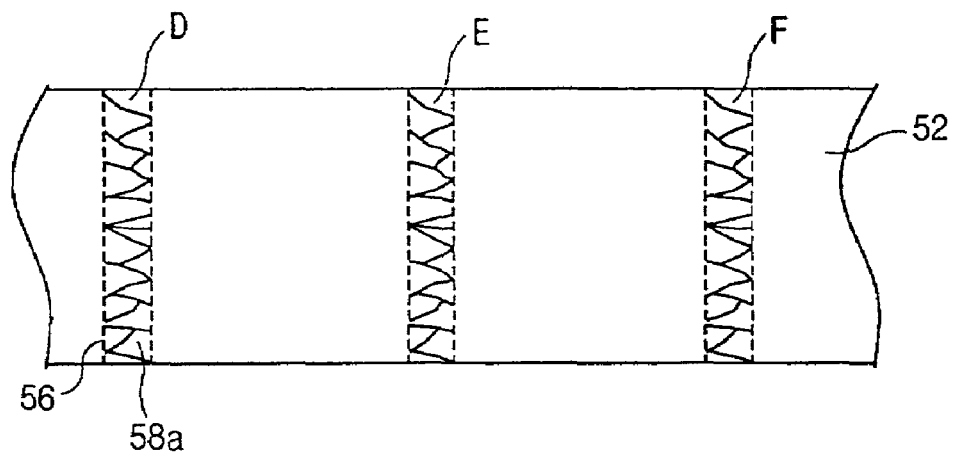
FIGS. 3A to 3C are plan views showing one block of an amorphous silicon film in the crystallization process steps using a conventional SLS apparatus.
Figure 3B:
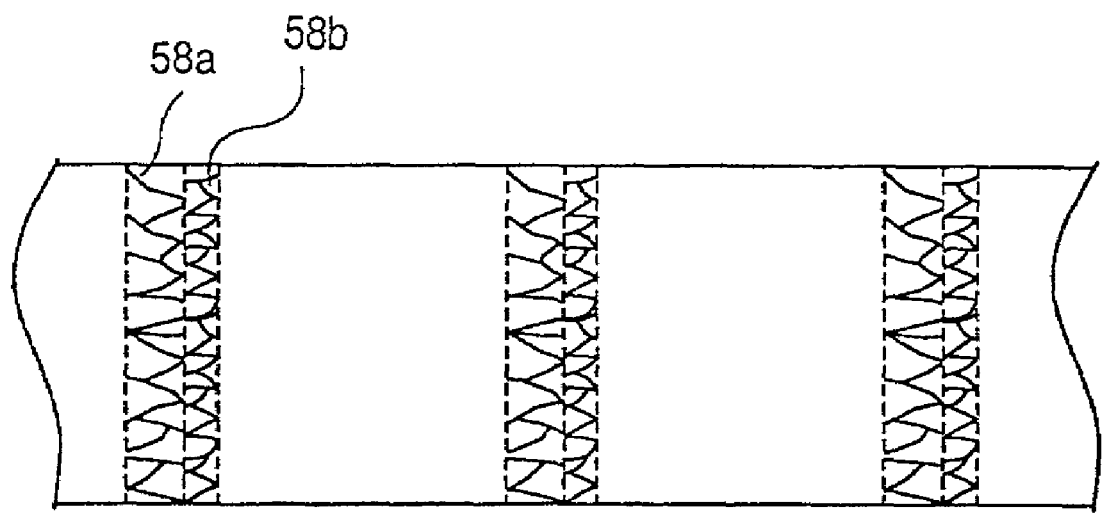
Figure 3C:
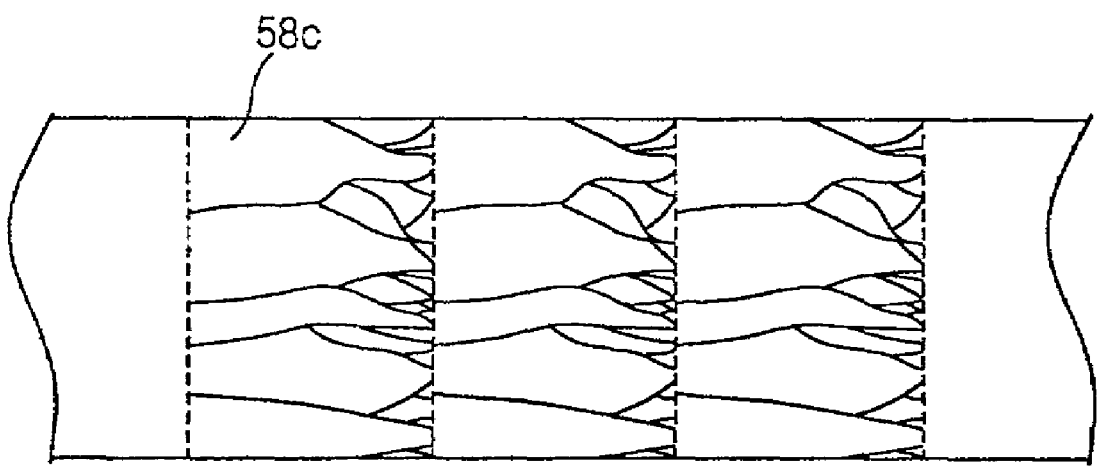
Figure 4:
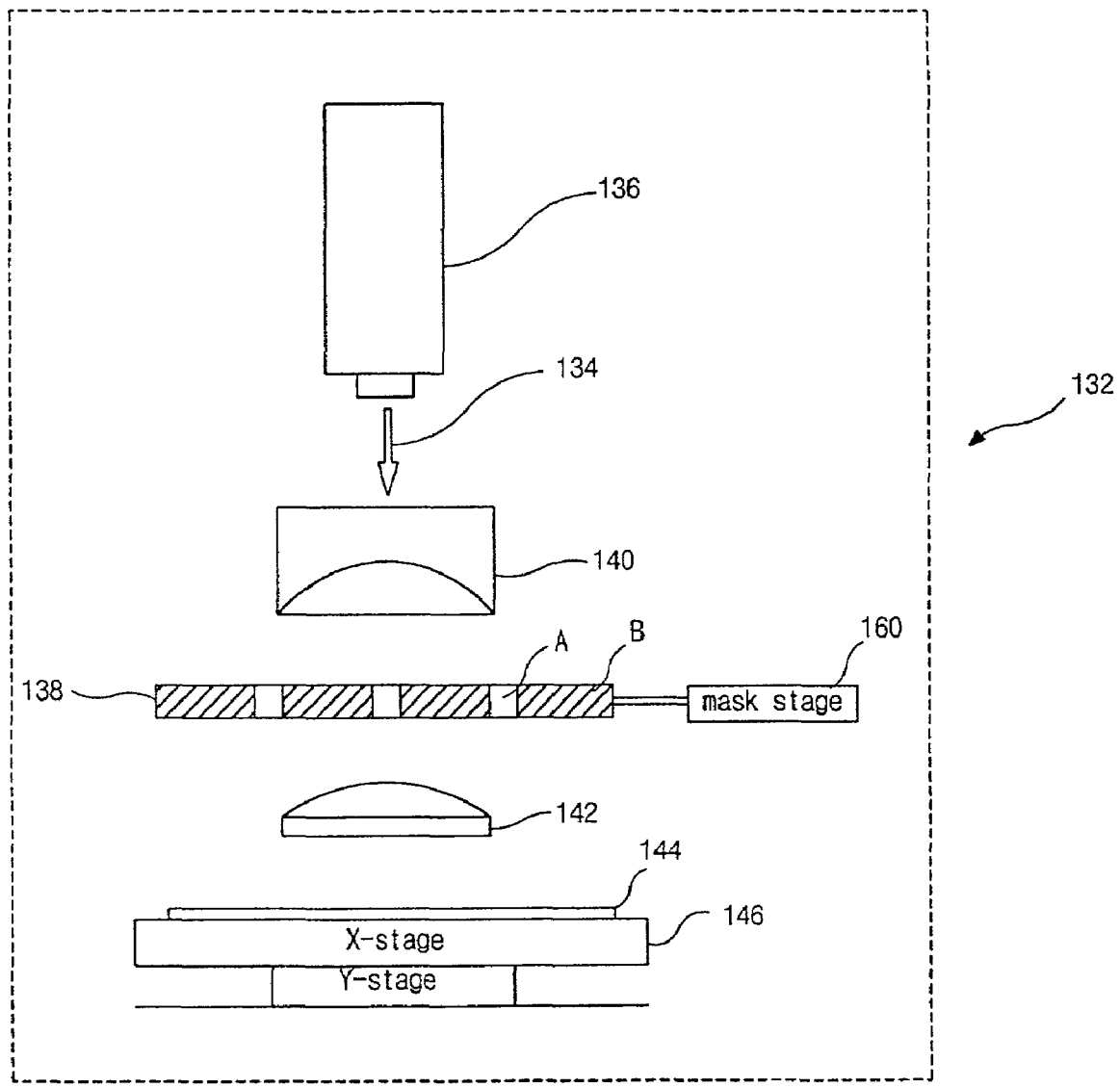
FIG. 4 is a schematic configuration of a sequential lateral solidification (SLS) apparatus according to the present invention.

FIG. 4 is a schematic configuration of a sequential lateral solidification (SLS) apparatus according to the present invention. In FIG. 4, the SLS apparatus 132 generally includes a laser generator 136, a mask 138, a condenser lens 140, an objective lens 142, an X-Y stage 146 and a mask stage 160. The laser generator 136 generates and emits a laser beam 134. The amount of the laser beam 134 emitted from the laser generator 136 is adjusted by an attenuator (not shown) that is in the path of the laser beam 134. The emitted laser beam 134 is then applied to the condenser lens 140 such that the laser beam 134 is condensed after passing the condenser lens 140. The mask 138 includes a plurality of slits "A" through which the laser beam 134 passes and light absorptive areas "B" that prevent the laser beam 134 from passing through the mask 138. At this point, the width of each slit "A" defines a size of the silicon grain crystallized by a first laser irradiation. Furthermore, the distance between each slit defines a length of the lateral grain growth when the amorphous silicon film is crystallized by the SLS method.

Still referring to FIG. 4, the objective lens 142 is arranged below the mask 138 and scales down the shape of the laser beam having passed through the mask 138. An X-Y stage 146 is arranged adjacent to the objective lens 142. The X-Y stage is movable in two orthogonal axial directions, such as x-axis and y-axis, and includes an x-axial direction drive unit for driving the x-axis stage and a y-axial direction drive unit for driving the y-axis stage. A substrate 144 is placed on the X-Y stage 146 in a location corresponding to the mask. Although not shown in FIG. 4, an amorphous silicon film is formed on the substrate 144, thereby defining a sample substrate.

In the present invention, the mask stage 160 is connected to the mask 138 such that it controls movement of the mask 138. Namely, the mask 138 is connected to the mask stage 160, and thus the mask 138 moves by a distance of several micrometers in accordance with a control of the mask stage 160. Since the mask stage 160 is small in size and has a small scale in moving the mask 138, it takes little time to move and stop the mask 138 rather than the X-Y stage of the conventional art. Therefore, when the amorphous silicon film is crystallized block by block, the movement of the laser beam within one block is controlled by the mask stage 160 because the mask stage 160 minutely moves the mask 138. Namely, the mask movement by the mask stage 160 controls the laser beam irradiation within one block, compared the conventional art in which the laser beam irradiation is controlled by the X-Y stage. Furthermore, since the mask movement by the mask stage 160 is minute and limited within one block, the X-Y stage 146 of FIG. 4 moves the sample substrate 144 when it needs to move block by block. As a result, the crystallization time decreases when the mask stage 160 and the X-Y stage 146 are used together in the crystallization rather than when only the X-Y stage is used.

FIGS. 5A to 5F show crystallization process steps of crystallizing an amorphous silicon film into a crystalline silicon film using the SLS apparatus of FIG. 4. In FIGS. 5A to 5F, the crystallization performed within one block will be explained as an example.

FIG. 5A shows the X-Y stage 146, the mask 138 and the mask stage 160 when initially crystallizing an amorphous silicon film 143 using a first laser beam irradiation. FIG. 5B is a plan view of the substrate 144 having the amorphous silicon film 143 thereon after the first laser beam irradiation. Referring to FIGS. 5A and 5B, after the substrate 144 having the amorphous silicon film 143 is mounted on the X-Y stage 146, the laser beam 134 emitted from the laser generator 136 passes through the mask 138 and irradiates one block of the amorphous silicon film 143. At this time, the laser beam 134 is divided into three line beams by the slits "A" of the mask 138, and then these line beams irradiates regions "G", "H" and "I" of the amorphous silicon film 143 in order to melt each region "G", "H" or "I". When the first laser beam irradiation is stopped, the liquid phase silicon rapidly begins to be crystallized at the interface 150 between the solid phase amorphous silicon and the liquid phase silicon. Namely, lateral grain growth of grains 148a proceeds from the un-melted regions adjacent to the fully-melted regions. The grain boundaries in directionally solidified silicon tend to form so as to always be perpendicular to the interface 156 between the solid phase amorphous silicon and the liquid phase silicon. As a result of the first laser beam irradiation, crystallized regions "G", "H" and "I" of FIG. 5B are finally formed in one block corresponding to the mask 138 of FIG. 5B, such that the crystallized silicon grain regions "G", "H" and "I" are induced. At this time of conducting the first laser beam irradiation, the width of each slit "A" defines the size of the grain 148a.

After the first laser beam irradiation process shown in FIGS. 5A and 5B, the mask stage 160 moves the mask 138 in a direction of lateral grain growth by a distance of several micrometers which is equal to or less than the length of the lateral growth.

FIG. 5C shows the X-Y stage 146, the mask 138 and the mask stage 160 when a second step of crystallizing the amorphous silicon film 143 is conducted using a second laser beam irradiation. FIG. 5B is a plan view of the substrate 144 having the amorphous silicon film 143 thereon after the second laser beam irradiation. Since the mask 138 moves for the second laser beam irradiation, the slits "A" correspond to regions adjacent to the crystallized silicon grain regions "G", "H" and "I".

When the second laser beam irradiation is conducted, the regions adjacent to the crystallized silicon grain regions "G", "H" and "I" of FIG. 5B are melted by the three line beams. Thereafter, when the second laser beam irradiation is stopped, the silicon grains 148a (see FIG. 5B) grown by the first laser beam irradiation serve as seeds for the crystallization, and thus, the lateral grain growth proceeds in the melted regions. Silicon grains 148b are finally formed by the second laser beam irradiation.

Accordingly, by repeating the foregoing steps of melting and crystallizing the amorphous silicon as described in FIG. 5E, one block of the amorphous silicon film is crystallized to form grains 148c as shown in FIG. 5F. Namely, FIG. 5F shows one block of a crystalline silicon film resulted from lateral growth of grains according to the present invention. Furthermore, it is noticeable in the above-mentioned SLS method that the lateral grain growth stops by making grain boundaries when the laterally grown grains collide. Therefore, the distance between each slit defines a length of the lateral grain growth, thereby controlling grain size.

After crystallizing one block of the amorphous silicon film, the other blocks of the amorphous silicon film are also crystallized by the aforementioned process. Additionally in the present invention, after complete crystallization of one block the X-Y stage 146 moves the substrate a relatively long distance for the crystallization of the next block by moving the sample substrate 144 in two orthogonal axial directions, such as x-axis and y-axis. The mask stage 160 moves the mask within one block to complete crystallization within one block.

As described before, since the SLS apparatus according to the present invention includes the mask stage that controls the minute movements of the mask, the crystallization time and the fabricating process time are reduced. Namely, it takes relatively short time to crystallize one block of the amorphous silicon film when utilizing the mask stage to move the mask rather than when utilizing the X-Y stage to move the substrate. Furthermore, the above-mentioned SLS method of crystallizing the amorphous silicon film can be adopted in crystallizing a large substrate.

It will be apparent to those skilled in the art that various modifications and variations can be made in the method of crystallizing the amorphous silicon without departing from the spirit or scope of the inventions. Thus, it is intended that the present invention cover the modifications and variations of this invention provided they come within the scope of the appended claims and their equivalents.

What is claimed is:

1. A method of crystallizing an amorphous silicon film using a sequential lateral solidification apparatus, which includes a laser generator generating and emitting a laser beam, an X-Y stage movable in two orthogonal axial directions, a mask arranged between the laser generator and the X-Y stage, the mask having a plurality of slits through which the laser beam passes, an objective lens arranged between the mask and the X-Y stage and the objective lens scaling down the laser beam, and a mask stage connected to the mask, the mask stage controlling fine movement of the mask, the method comprising:

setting a substrate having an amorphous silicon film thereon upon the X-Y stage;

irradiating the laser beam to the amorphous silicon film through the plurality of slits of the mask, thereby melting and crystallizing first portions of a block, wherein the mask defines a block in the amorphous silicon film and wherein the first portions are crystallized by sequential lateral solidification that grows grains along a first direction from interfaces between solid phase amorphous silicon and liquid phase silicon;

stepping the mask in the first direction by several micrometers using the mask stage after completing the crystallization for the first portions;

irradiating the laser beam to next portions of the block of the amorphous silicon film through the plurality of slits of the mask stepped, wherein the next portions of the block are adjacent to the first portions, and wherein the stepping of the mask in the first direction by the mask stage and the irradiation of the laser beam thereafter are repeated until a lateral grain growth stops in the block by a collision of laterally grown grains, thereby completing the crystallization within the block in the amorphous silicon film;

stepping the X-Y stage block by block in the first direction to crystallize another block of the amorphous silicon film after completing the crystallization in the previous block; and repeatedly melting and crystallizing another block of the amorphous silicon film whenever the X-Y stage steps.

2. The method according to claim 1, wherein the laser beam irradiates the amorphous silicon film whenever the mask steps by the mask stage.

3. The method according to claim 1, wherein the mask stage steps the mask in a direction of lateral grain growth by a distance which is equal to or less than the length of the lateral grain growth.

4. The method according to claim 1, wherein the sequential lateral solidification apparatus includes a condenser lens between the mask and the laser generator.

5. The method according to claim 4, wherein the condenser lens condenses the laser beam.

6. The method according to claim 1, wherein a distance over which the X-Y stage steps is greater than a distance over which the mask controlled by the mask stage steps.

7. A method of crystallizing an amorphous silicon film using a sequential lateral solidification apparatus, comprising:

providing a substrate having an amorphous silicon film thereon on an X-Y stage;

irradiating a laser beam to the amorphous silicon film through a mask having plurality of slits so that first portions of the amorphous silicon film are melted and crystallized, wherein the mask defines a block in the amorphous silicon film and wherein the first portions are crystallized by sequential lateral solidification that grows grains along a first direction from interfaces between solid phase amorphous silicon and liquid phase silicon;

stepping the mask in the first direction by several micrometers after completing the crystallization for the first portions;

irradiating the laser beam to next portions of the block of the amorphous silicon film through the plurality of slits of the mask stepped, wherein the next portions of the block are adjacent to the first portions, and wherein stepping the mask in the first direction and irradiating the laser beam thereafter are repeated until a lateral grain growth stops in the block by a collision of laterally grown grains, thereby completing the crystallization within the block in the amorphous silicon film;

stepping the substrate block by block in the first direction to correspond to a next block of the amorphous silicon film after completing the crystallization in the previous block, the next block having a portion with uncrystallized silicon film; and repeatedly melting and crystallizing portions of the next block of the amorphous silicon film by stepping the mask until a lateral grain growth in the next block stops by a collision of laterally grown grains.

8. The method according to claim 7, wherein the laser beam is applied to the amorphous silicon film after each time the mask is stepped.

9. The method according to claim 7, wherein the mask is stepped in a direction of lateral grain growth by a distance which is equal to or less than the length of the lateral growth.

10. The method according to claim 7, wherein a distance by which the substrate is stepped is greater than a distance by which the mask is stepped.

* * * * *